(12) United States Patent
Sun et al.

(10) Patent No.: US 12,317,592 B2
(45) Date of Patent: May 27, 2025

(54) DISPLAY PANEL AND DISPLAY DEVICE

(71) Applicant: WUHAN CHINA STAR OPTOELECTRONICS TECHNOLOGY CO., LTD., Hubei (CN)

(72) Inventors: Yuan Sun, Hubei (CN); Chao Wang, Hubei (CN); Guanghui Liu, Hubei (CN); Liwang Liu, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 459 days.

(21) Appl. No.: 17/596,870

(22) PCT Filed: Dec. 15, 2021

(86) PCT No.: PCT/CN2021/138433
§ 371 (c)(1),
(2) Date: Dec. 20, 2021

(87) PCT Pub. No.: WO2023/102980
PCT Pub. Date: Jun. 15, 2023

(65) Prior Publication Data
US 2023/0178564 A1     Jun. 8, 2023

(30) Foreign Application Priority Data

Dec. 8, 2021 (CN) .......................... 202111488539.2

(51) Int. Cl.
*H10K 59/82*     (2023.01)
*H10D 86/40*     (2025.01)
(Continued)

(52) U.S. Cl.
CPC ........... *H10D 86/60* (2025.01); *H10D 86/441* (2025.01)

(58) Field of Classification Search
CPC . H01L 27/124; H01L 27/1214; H10K 59/131; H10K 59/179; H10K 59/82
See application file for complete search history.

(56) References Cited

U.S. PATENT DOCUMENTS 9,735,219 B2 * 8/2017 An .................. H10K 59/131
10,115,780 B2 * 10/2018 Kim .................. H10K 59/88
(Continued)

FOREIGN PATENT DOCUMENTS

CN   101424838 A  *  5/2009
CN   102636926 A  *  8/2012  ....... G02F 1/136286
(Continued)

OTHER PUBLICATIONS

International Search Report in International application No. PCT/CN2021/138433, mailed on Jul. 1, 2022.
(Continued)

*Primary Examiner* — Eduardo A Rodela
(74) *Attorney, Agent, or Firm* — PV IP PC; Wei Te Chung (57) ABSTRACT

A display panel and a display device are provided. The display panel includes an active layer, a gate electrode layer, and a metal layer. By forcibly pulling down an electrical potential of a scan signal in a first scan line when a pulse rising edge of the scan signal in the second scanning line arrives, an electrical potential falling time of each scan signal in a display area can be shortened. At the same time, a control line is constructed to at least partially overlaps an electrical potential transmission line in a thickness direction of the display panel, to increase an aperture ratio as much as possible.

19 Claims, 3 Drawing Sheets

(51) Int. Cl.
*H10D 86/60* (2025.01)
*H10K 59/131* (2023.01)

(56) References Cited

U.S. PATENT DOCUMENTS

| | | | |
|---|---|---|---|
| 10,411,083 B2* | 9/2019 | Song | H10K 59/40 |
| 10,424,630 B2* | 9/2019 | Han | H10K 59/131 |
| 10,790,348 B2* | 9/2020 | Lee | H10K 59/131 |
| 10,943,970 B2* | 3/2021 | Jo | H10K 59/131 |
| 11,049,929 B2* | 6/2021 | Jeon | H10K 71/00 |
| 11,120,737 B2* | 9/2021 | Kim | H01L 29/40 |
| 11,263,429 B2* | 3/2022 | Lee | H10K 59/131 |
| 11,600,234 B2* | 3/2023 | Lai | H10K 59/131 |
| 2017/0084239 A1 | 3/2017 | Lee et al. | |
| 2018/0101072 A1 | 4/2018 | Lazo et al. | |
| 2018/0308918 A1* | 10/2018 | Choi | G09G 3/3233 |
| 2020/0395433 A1* | 12/2020 | Sung | H10K 59/131 |
| 2022/0085120 A1* | 3/2022 | Lee | H10K 59/131 |

FOREIGN PATENT DOCUMENTS

| | | | | |
|---|---|---|---|---|
| CN | 105139821 A | 12/2015 | | |
| CN | 105372894 A | 3/2016 | | |
| CN | 109524445 A | 3/2019 | | |
| CN | 109904214 A | 6/2019 | | |
| CN | 111785221 A | 10/2020 | | |
| CN | 113066800 A | 7/2021 | | |
| CN | 113394237 A | 9/2021 | | |
| KR | 20150075184 A | 7/2015 | | |
| WO | WO-2013063814 A1 * | 5/2013 | | G02F 1/136286 |

OTHER PUBLICATIONS

Written Opinion of the International Search Authority in International application No. PCT/CN2021/138433, mailed on Jul. 1, 2022.
Chinese Office Action issued in corresponding Chinese Patent Application No. 202111488539.2 dated Jan. 26, 2025, pp. 1-9.

* cited by examiner

DISPLAY PANEL AND DISPLAY DEVICE

FIELD OF INVENTION

The present application relates to display technologies, and more particularly, to a display panel and a display device.

BACKGROUND OF INVENTION

With a development of display technology, refresh frequency has increasingly become one of the important indicators for measuring display effects. High refresh rate screens can bring a smoother visual experience and reduce human eye fatigue. With an adaptation of various application software to high refresh rate screens, consumers can also get a better feeling and an entertainment experience from high refresh rate screens. A refresh rate of traditional display devices is generally 60 Hz. In recent years, with a development of technology, display devices with 90 Hz, 120 Hz, 150 Hz and even higher refresh rates have appeared one after another. From a perspective of panel design, achieving a higher refresh rate will be affected by factors such as device performance, drive capability, and charging rate, etc. For example, during a progressive scan process, a falling edge or a rising edge of a previous scan signal will cause a turn-off or turn-on delay due to a row load. Further, a display crosstalk caused by abnormal charging will occur when the progressive scan speed is faster.

Therefore, it is necessary to provide a display panel in which the time required for the falling edge or the rising edge of the scan signal is shorter in a display region, and an aperture ratio is as high as possible at the same time.

It should be noted that the above-mentioned introduction of a background technology is only for a purpose of facilitating a clear and a complete understanding of the technical solutions of the present application. Therefore, it cannot be considered that the above-mentioned technical solutions involved are known to those skilled in the art just because it appears in a background art of the present application.

SUMMARY OF INVENTION

The present application provides a display panel and a display device to alleviate the technical problems of long time and low aperture ratio in an electrical potential jump process of a scan signal in a display region.

In a first aspect, the present application provides a display panel, including an active layer including a source connection region of an auxiliary transistor and a drain connection region of the auxiliary transistor;
 a gate electrode layer including a control line, a gate electrode of the auxiliary transistor, a first scan line, and a second scan line, and wherein the first scan line, the second scan line are disposed in sequence along a first direction, a first terminal of the control line is electrically connected to the first scan line, and the second scan line is electrically connected to the gate electrode of the auxiliary transistor; and
 a metal layer including an electrical potential transmission line, a source electrode of the auxiliary transistor, and a drain electrode of the auxiliary transistor, and wherein the source electrode of the auxiliary transistor is electrically connected to the source connection region of the auxiliary transistor and a second terminal of the control line, and wherein the drain electrode of the auxiliary transistor is electrically connected to the electrical potential transmission line and the drain connection region of the auxiliary transistor;
 wherein a projection of the electrical potential transmission line at least partially overlaps a projection of the control line in a thickness direction of the display panel.

In some of the embodiments, the metal layer further includes a first data line and a second data line, and wherein the first data line and the second data line are sequentially arranged along a second direction, and wherein in the second direction, the electrical potential transmission line is positioned between the first data line and the second data line, and the electrical potential transmission line is close to the second data line.

In some of the embodiments, the active layer further includes a channel region of the auxiliary transistor, and wherein the channel region of the auxiliary transistor is positioned between the source connection region of the auxiliary transistor and the drain connection region of the auxiliary transistor, and wherein the source connection region of the auxiliary transistor, the channel region of the auxiliary transistor, the drain connection region of the auxiliary transistor are sequentially arranged along the first direction.

In some of the embodiments, the electrical potential transmission line includes a first trunk portion, and wherein the control line includes a second trunk portion, and wherein a projection of the second trunk portion on the metal layer overlaps with a projection of the first trunk portion on the metal layer, and wherein an extending direction of the second data line is the same as an extending direction of the first trunk portion or an extending direction of the second trunk portion.

In some of the embodiments, a distance between the first trunk portion and the second data line ranges from 1.2 micrometers to 2.8 micrometers in the second direction.

In some of the embodiments, the electrical potential transmission line further includes a first winding part, and wherein the control line further includes a second winding part, and wherein a projection of the second winding part on the metal layer overlaps the first winding part, and wherein a distance between the projection of the drain connection region of the auxiliary transistor on the metal layer and the first winding part is less than a distance between the projection of the drain connection region of the auxiliary transistor on the metal layer and the first trunk portion.

In some of the embodiments, the second scan line includes a third trunk portion and a third winding part, and wherein the third winding part includes a first straight portion, a second straight portion, and a third straight portion connected terminal to terminal in sequence, and wherein an extending direction of the second straight portion and an extending direction of the third trunk portion are parallel to each other, and wherein the third trunk portion and the first straight portion or the third straight portion and the second straight portion are disposed in sequence along the first direction and the projections of the third trunk portion and the first straight portion or the third straight portion and the second straight portion in the first direction do not overlap each other;
 a distance between a projection of the second straight portion on the active layer and the source connection region of the auxiliary transistor in the first direction is less than a first distance, and wherein the first distance is a sum of a width of the third trunk portion in the first direction and a second distance, and wherein the second distance is a distance between the second straight portion and the third trunk portion in the first direction.

In some of the embodiments, the active layer further includes a semiconductor structure of a writing transistor, and wherein a projection of the first data line on the active layer overlaps and is electrically connected to a part of the semiconductor structure in a thickness direction of the display panel, and wherein a projection of the other part of the semiconductor structure on the metal layer is positioned between the first data line and the second data line, wherein the writing transistor is configured to control the data signal to be written into the corresponding pixel.

In some of the embodiments, the display panel further includes a gate driving circuit, and wherein the gate driving circuit is provided on at least one side of the display panel, and wherein the greater the distance from the gate driving circuit, the same or gradually increase distribution densities of the auxiliary transistors, and wherein the distribution density is a number of the auxiliary transistors in a unit area.

In a second aspect, the present application provides a display device including the display panel in at least one of the above embodiments, wherein the first scan line is configured to transmit a first scan signal, and the second scan line is configured to transmit a second scan signal, and wherein a pulse of the first scan signal is earlier than a pulse of the second scan signal in a same frame.

A display panel and a display device are provided in the present application, an electrical potential of a scan signal in a first scan line is forcibly pulled down when a pulse rising edge of the scan signal in the second scanning line arrives, or an electrical potential of a scan signal in a first scan line is forcibly pulled up when a pulse down edge of the scan signal in the second scanning line arrives, by electrically connecting a first terminal of a control line and a first scan line, electrically connecting a second scan line and a gate electrode of an auxiliary transistor, electrically connecting a source electrode of the auxiliary transistor and a source connection region of the auxiliary transistor, and a second terminal of the control line, and electrically connecting a drain electrode of the auxiliary transistor, an electrical potential transmission line, and a drain connection region of the auxiliary transistor to short an electrical potential falling time of each scan signal in the display region or to short an electrical potential raising time of each scan signal in the display region. At the same time, separately construct the control line on the gate electrode layer and the electrical potential transmission line on the metal layer. In addition, a projection of the control line at least partially overlaps a projection of the electrical potential transmission line in the thickness direction of the display panel. A layout of the new structures such as the control line, the electrical potential transmission line, and the auxiliary transistor can be completed with less space, which is able to increase an aperture ratio as much as possible.

DETAILED DESCRIPTION OF EMBODIMENTS

In order to make a purpose, technical solutions, and effects of the present application more specific and clearer, the following further describes the present application in detail with reference to the accompanying figures and examples. It should be understood that the specific embodiments described here are only used to explain the present application, and are not used to limit the present application.

Figure 1:
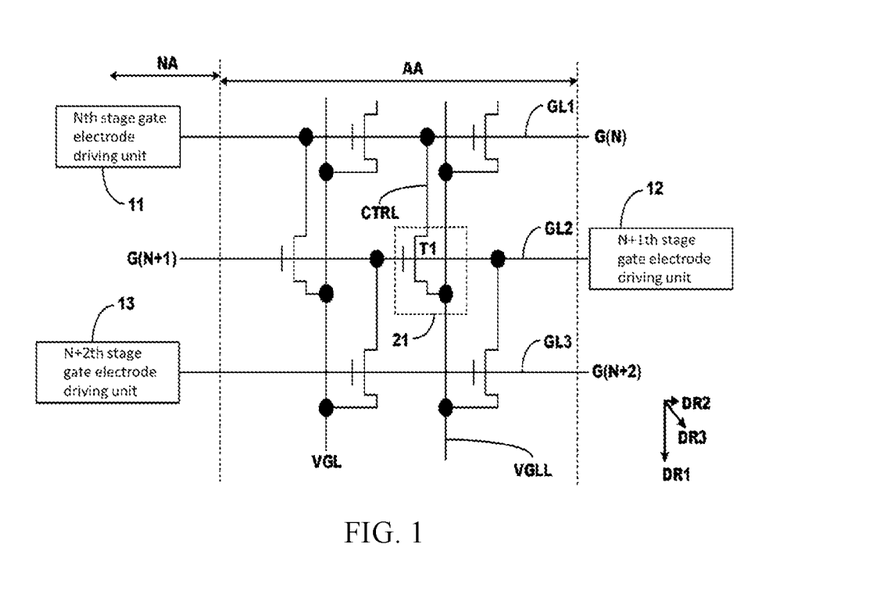
FIG. 1 shows a schematic diagram of an electrical principle of a display panel provided by one embodiment of the present application.

In view of the shortcomings of the traditional solution that the falling edge or rising edge of the scan signal in the display regions takes a long time. The present embodiment provides a display panel, please refer to FIGS. 1 to 4, as shown in FIG. 1, the display panel can be divided into a display region AA and a non-display region NA. A plurality of gate electrode driving units include a Nth stage gate electrode driving unit 11, a N+1th stage gate electrode driving unit 12, and a N+2th stage gate electrode driving unit 13 constructed in the non-display region NA to form a gate driving circuit required by the display panel. The gate driving circuit can be constructed in at least one non-display region NA on both sides of the display region AA, for example, the Nth stage gate electrode driving unit 11 and the N+2th stage gate electrode driving unit 13 are disposed in a left non-display region NA, and the N+1th stage gate electrode driving unit 12 is disposed in a right non-display region NA. For example, a plurality of scan lines include a Nth scan line GL1 configured to transmit a Nth level scan signal G(N), a N+1th scan line GL2 configured to transmit the N+1th level scan signal G(N+1), and the N+2th scan signal G(N+2) configured to transmit the N+2th scan line GL3 electrically connected to the output terminal of each gate electrode driving unit extend into the display region AA, and these scan lines are disposed in sequence along a first direction DR1. A falling edge of the Nth level scan signal G(N) may be at the same time or similar to a rising edge of the N+1th level scan signal G(N+1).

A flow direction of the Nth level scan signal G(N) in the Nth scan line GL1 is from left to right, a flow direction of the N+1th level scan signal G(N+1) in the N+1th scan line GL2 is from right to left, and a flow direction of the N+2 scan signal G (N+2) in the N+2 scan line GL3 is from left to right, and so on, the flow direction of each scan signal is always from the input terminal of the corresponding scan line to its output terminal.

At least one auxiliary unit 21 is provided in the display region AA. Each auxiliary unit 21 may include one or more auxiliary transistors T1. One of a source electrode or a drain electrode of the auxiliary transistor T1 may be electrically connected to the electrical potential transmission line VGLL configured to transmit a low electrical potential signal VGL. Another one of the source electrode or the drain electrode of the auxiliary transistor T1 can be electrically connected to one terminal of the control line CTRL. Another terminal of the control line CTRL can be electrically connected to the Nth scan line GL1. A gate electrode of the auxiliary transistor T1 can be electrically connected to a N+1th scan line GL2, and N can be a positive integer. With a change of N, the auxiliary transistor T1 can be distributed in different positions of the display region AA to shorten an electrical potential falling time or an electrical potential rising time of each scan signal in display region AA.

It is understandable that an addition of the auxiliary unit 21 can effectively reduce or shorten a time period required for the scan signal to fall from a high electrical potential to a low electrical potential or a time period required for the scan signal to rise from the low electrical potential to the high electrical potential. The auxiliary 21 can quickly and forcibly pull down the electrical potential of the Nth level scan signal G(N) to a predetermined low electrical potential to response to a rising edge of one of the N+1th level scan signal G (N+1), the N+2 level scan signal G (N+2), the N+3 level scan signal, or the N+4 level scan signal arrived. The auxiliary unit 21 can quickly and forcibly pull up the electrical potential of the Nth level scan signal G(N) to a predetermined high electrical potential to response to a falling edge of the N+1th level scan signal G(N+1), the N+2th level scan signal G (N+2), the N+3th level scan signal, or the N+4th level scan signal arrived. Thereby a crosstalk phenomenon of the data signal can be significantly improved.

For example, when the scan signal transmitted in the display panel has a positive pulse, the auxiliary transistor T1 can be a N-channel thin film transistor, the electrical potential transmission line can be configured to transmit a low electrical potential signal, if the first scan line is the Nth scan line GL1, the second scan line can be one of the N+1th scan line GL2, the N+2th scan line GL3, or the N+3th scan line. At this time, the auxiliary 21 can quickly and forcibly pull down the electrical potential of the Nth level scan signal G(N) to the predetermined low electrical potential to response to the rising edge when one of the N+1th level scan signal G (N+1), the N+2 level scan signal G (N+2), the N+3 level scan signal, and the N+4 level scan signal arrived; when the scan signal transmitted in the display panel has a negative pulse, the auxiliary transistor T1 can be a P-channel thin film transistor, the electrical potential transmission line can be configured to transmit a high electrical potential signal, if the first scan line is the Nth scan line GL1, the second scan line can be one of the N+1th scan line GL2, the N+2th scan line GL3, and the N+3th scan line. At this time, the auxiliary unit 21 can quickly and forcibly pull up the electrical potential of the Nth-level scan signal G(N) to the predetermined high electrical potential to response a falling edge of one of the N+1 level scan signal G(N+1), the N+2 level scan signal G(N+2), the N+3 level scan signal, and the N+4 level scan signal arrives. In this way, the time for the falling edge or rising edge of each scan signal can be shortened, and the crosstalk phenomenon of the data signal can be significantly improved.

Figure 2:
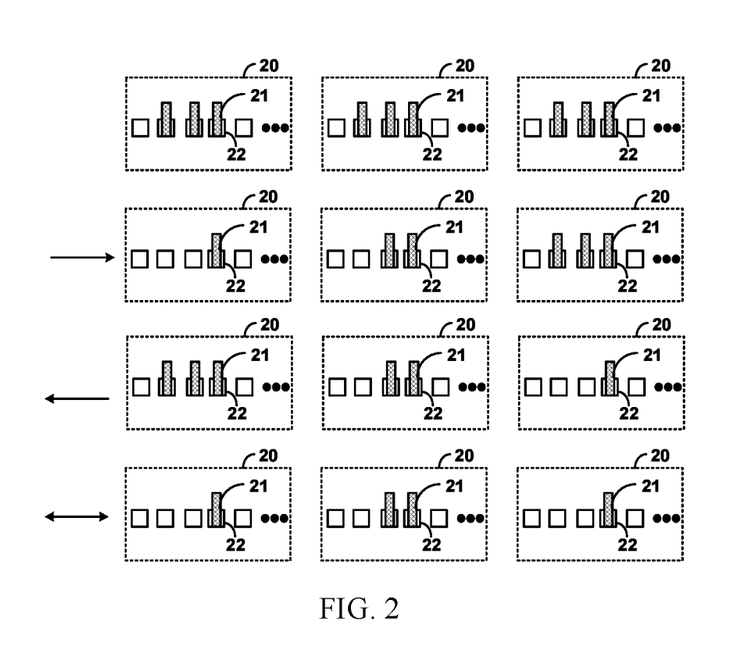
FIG. 2 is a schematic diagram of a distribution of auxiliary units provided by one embodiment of the present application.

As shown in FIG. 2, the display panel can be configured with a plurality of rows of pixels 22, and each scan line may be electrically connected to a corresponding row pixel. Each row pixel can be divided into a plurality of partitions 20, wherein a number of the pixels 20 in each partition 20 can be equal. For example, a number of pixels in a row can be 2560, a number of pixels 20 in each partition 20 can be 256, and each row of pixels can be divided into 10 partitions 20. That is, the number of partitions 20 can increase as the number of pixels in each row increase.

A number of auxiliary units 21 in each partition 20 in the same row of pixels may be zero, one or more.

Specifically, the number of auxiliary units 21 in each partition 20 positioned in the same row may be but not limited to the same. Specifically, as shown in the first row in FIG. 2, the number of auxiliary units 21 in each partition 20 are the same, for example, there may be 3 auxiliary units 21, or 4 auxiliary units 21 and so on. The display panel may include a gate electrode driving circuit, and each gate driving circuit may include a plurality of cascaded gate electrode driving units. If the output terminal of the gate electrode driving unit, that is, the input terminal of each scan line, is configured to as the corresponding scan signal source, a distribution density of the auxiliary transistors in each partition 20 can be gradually increased as a distance from the corresponding scan signal source increased. That is, in a same row pixel, the distribution density of the auxiliary transistors forms a stepped arrangement, which can be from small to large, or from large to small. So that a waveform or the time required for the electrical potential of the scan signals to drop to low electrical potentials at different positions are the same or similar. For example, if there are 2560 pixels 22 in a horizontal direction, the pixels are divided into 10 partitions 20 along the horizontal direction, and a gate electrode signal of the first row is provided from the left. As a distance between the odd-numbered rows and the corresponding scan signal source increases, a density of the auxiliary unit 21 also increases, wherein a number of auxiliary units 21 may be 1, 2, . . . , 10 per partition, correspondingly, a number of auxiliary units 21 in even-numbered rows may be 10, 9, 8, . . . , 1 per partition, respectively.

The display panel can be divided into a display region, and a first frame region and a second frame region positioned on both sides of the display region. The gate driving circuit can be arranged in the first frame regions and/or the second frame region.

Specifically, in the second row or the third row as shown in FIG. 2, for example, the gate driving circuit may be disposed in the first frame region or the second frame region. In the second row shown in FIG. 2, when the gate driving circuit is disposed in the first frame region, that is, the left frame region, the scan signal flows from left to right as shown by an arrow in the second row shown in FIG. 2. At the same time, as a distance from the partition 20 to the gate driving circuit increased, a number of auxiliary units 21 in each partition 20, that is, a density of the auxiliary units 21, also increased. For example, from left to right, one auxiliary unit 21 may be provided in a first partition 20, two auxiliary units 21 may be provided in a second partition 20, three auxiliary units 21 may be provided in a third partition 20, and so on. As shown in the third row of FIG. 2, when the gate driving circuit is arranged in the second frame region, that is, the right frame region, the scan signal flows from right to left as shown by an arrow shown in the third row in FIG. 2. As a distance from the partition 20 to the gate driving circuit increases, the number of auxiliary units 21 in each partition 20, that is, the density of the auxiliary units 21, also increased. For example, from right to left, one auxiliary unit 21 may be provided in a first partition 20, two auxiliary units 21 may be provided in a second partition 20, three auxiliary units 21 may be provided in a third partition 20, and so on.

For another embodiment, one gate driving circuit can be disposed in the first frame region and the second frame region at the same time. The odd-numbered gate driving units in the gate driving circuit can be disposed in the first frame region, and the auxiliary unit 21 can adopt the distribution scheme of the second row in FIG. 2 as described above. The even-numbered stages in the gate driving circuit of the gate electrode driving unit may be disposed in the second frame region, and the auxiliary unit 21 may adopt the distribution scheme of the third row in FIG. 2 as described above.

For another example, the display panel may include two gate electrode driving circuits, one gate electrode driving circuit is disposed in the first frame region, another gate electrode driving circuit is disposed in the second frame region. A same scan line is electrically connected to the corresponding output terminals of the two gate electrode driving circuits. The flow direction of the scan signal in each scan line flows from the both terminals to the middle as shown by the arrow in a fourth row shown in FIG. 2. In this way, the closer to the central region of the display panel, the greater the density of the auxiliary units or the auxiliary transistors. For example, from left to right, the first partition 20 can be disposed one auxiliary unit 21, the second partition 20 can be disposed two auxiliary units 21, and so on to a middle partition 20 of the current row. From right to left, the first partition 20 can be disposed one auxiliary unit 21, the second partition 20 can be disposed two auxiliary units 21, and so on to the middle partition 20 of the current row.

Figure 3:
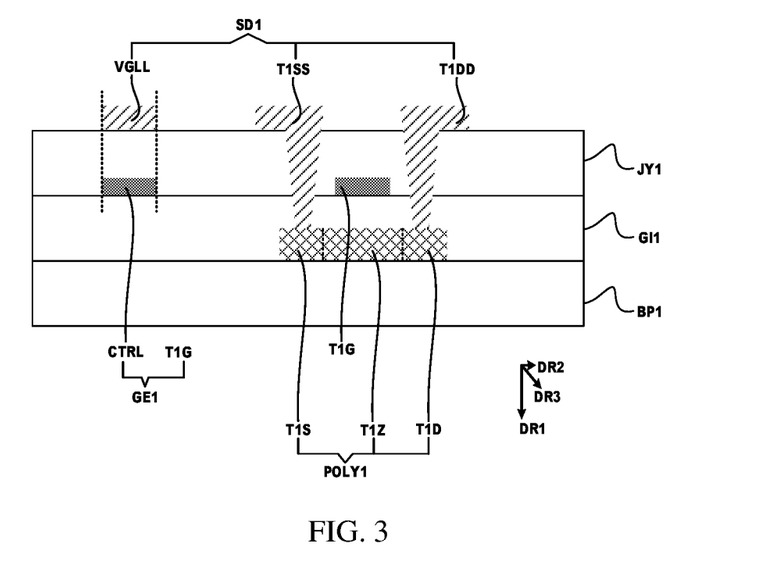
FIG. 3 is a schematic diagram of a cross-sectional structure of an auxiliary transistor, a control line, and an electrical potential transmission line provided by one embodiment of the present application.

As shown in FIG. 3, the display panel may include a substrate BP1, an active layer POLY1, a gate insulating layer G11, a gate electrode layer GE1, an insulating layer JY1, and a metal layer SD1 that are sequentially stacked in a thickness direction DR3.

The active layer POLY1 may include a source connection region T1S of the auxiliary transistor, a channel region T1Z of the auxiliary transistor, and a drain connection region T1D of the auxiliary transistor.

The gate electrode layer GE1 may include the gate electrode T1G of the auxiliary transistor and the control line CTRL.

The metal layer SD1 may include an electrical potential transmission line VGLL, a source electrode T1SS of the auxiliary transistor, a drain electrode T1DD of the auxiliary transistor, and a data line. The control line CTRL may be electrically connected to the source electrode T1SS of the auxiliary transistor. The electrical potential transmission line VGLL may be electrically connected to the source electrode T1SS of the auxiliary transistor. The drain electrode T1DD may be electrically connected to the electrical potential transmission line VGLL. In the thickness direction DR3, a projection of the electrical potential transmission line VGLL on the metal layer SD1 may partially or completely overlap with the control line CTRL.

Figure 4:
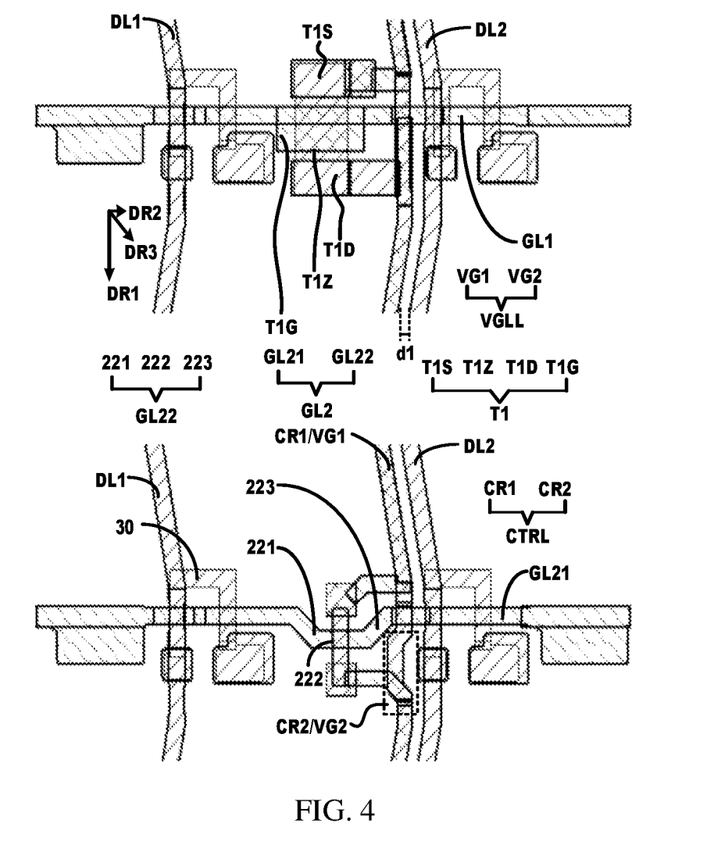
FIG. 4 is a schematic diagram of a layout design of a display panel provided by one embodiment of the present application.

As shown in FIG. 4, in the display panel, the first scan line and the second scan line are sequentially disposed along the first direction DR1. One terminal of the control line CTRL is electrically connected to the first scan line. The second scan line is electrically connected to the gate electrode of the auxiliary transistor T1. The metal layer SD1 includes the source electrode of the auxiliary transistor T1, the drain electrode of the auxiliary transistor T1, and the electrical potential transmission line VGLL. The source electrode of the auxiliary transistor T1 is electrically connected to the source connection area T1S of the auxiliary transistor T1, another terminal of the control line CTRL. The drain electrode of the auxiliary transistor T1 is electrically connected to the electrical potential transmission line VGLL and the drain electrode connection region T1D of the auxiliary transistor T1. In the thickness direction DR3 of the display panel, at least partially of the projection of the electrical potential transmission line VGLL on the gate electrode layer GE1 overlaps the control line CTRL.

It can be understood that, in this embodiment, the control line CTRL is constructed in the gate layer GE1, the electrical potential transmission line VGLL is constructed in the metal layer SD1. The control line CTRL at least partially overlaps the electrical potential transmission line VGLL in the thickness direction DR3 of the display panel. A layout of the newly added structures including the control line CTRL, the electrical potential transmission line VGLL, and the auxiliary transistor T1 can be completed with less space, and the aperture ratio of the display panel can be increased as much as possible.

The first scan line may be a previous scan line, such as the Nth scan line GL1, and the second scan line may be the next scan line, such as the N+1th scan line GL2.

In one of the embodiments, the first data line DL1 and the second data line DL2 are sequentially arranged along the second direction DR2. In the second direction DR2, the electrical potential transmission line VGLL is positioned between the first data line DL1 and the second data line DL2, and close to the second data line DL2. It can be understood that, in this embodiment, the electrical potential transmission line VGLL and the control line CTRL are constructed between the first data line DL1 and the second data line DL2, and are close to the second data line DL2, so that a more compact layout design can be realized.

In one of the embodiments, the channel region T1Z of the auxiliary transistor T1 is positioned between the source connection region T1S of the auxiliary transistor T1 and the drain connection region T1D of the auxiliary transistor T1. The source connection region T1S of the auxiliary transistor T1, the channel region T1Z of the auxiliary transistor T1, and the drain connection region T1D of the auxiliary transistor T1 are sequentially arranged along the first direction DR1. The auxiliary transistor T1 can be constructed vertically to save a lateral space of the display panel so as to be constructed with the writing transistor between two data lines simultaneously.

In one of the embodiments, the electrical potential transmission line VGLL includes a first trunk portion VG1, the control line CTRL includes a second trunk portion CR1, and the projection of the second trunk portion CR1 on the metal layer SD1 overlaps the first trunk portion VG1. The extending direction of the second data line DL2 is the same as the extending direction of the first trunk portion VG1 or the extending direction of the second trunk portion CR1. It can be understood that the electrical potential transmission line VGLL and/or the control line CTRL can extend synchronously or in parallel with the second data line DL2 to reduce a coverage area of the black matrix and increase the aperture ratio.

In one of the embodiments, in the second direction DR2, a distance d1 between the first trunk portion VG1 and the second data line DL2 ranges from 1.2 µm to 2.8 µm. It is understandable that this can further reduce the coverage area of the black matrix to obtain a higher aperture ratio. Preferably, a distance d1 between the first trunk portion VG1 and the second data line DL2 can also be 2.2 microns, so that not only a better aperture ratio can be obtained, at the same time, it can avoid or reduce an adverse effects caused by an electrical coupling between the electrical potential transmission line VGLL, the control wiring CTRL, and the second data line DL2 due to a distance.

A distance between the second trunk portion CR1 and the second data line DL2 may be the same as a distance between the first trunk portion VG1 and the second data line DL2.

In one of the embodiments, the electrical potential transmission line VGLL further includes a first winding part VG1. The control line CTRL further includes a second winding part CR2. A projection of the second winding part CR2 on the metal layer SD1 overlaps the first winding part VG1. A distance between the projection of the drain connection region T1D of the auxiliary transistor T1 on the metal layer SD1 and the first winding part VG2 is less than a distance between the projection of the drain connection region T1D of the auxiliary transistor T1 on the metal layer SD1 and the first trunk portion VG1. It can be understood that, in this way, the extending direction of the first winding part VG2 can be configured to face the drain connection region T1D of the auxiliary transistor T1, thereby a line distance between the drain connection region T1D of the auxiliary transistor T1 and the first winding part VG2 can be shortened, and a corresponding through hole can be conveniently provided on the second data line DL2. A width of the through hole may be larger than a width of the second data line DL2 in the first direction DR1.

In one of the embodiments, the second scan line, that is, the N+1th scan line GL2 includes a third trunk portion GL21 and a third winding part GL22. The third winding part GL22 may include a first straight portion 221, a second straight portion 222, and a third straight portion 223 connected terminal to terminal in sequence. An extending direction of the second straight portion 222 and an extending direction of the third trunk portion GL21 are parallel to each other. The third trunk portion GL21 and the first straight portion 221 or the third straight portion 223 and the second straight portion 222 are disposed in sequence along the first direction DR1 and the projections of the third trunk portion GL21 and the first straight portion 221 or the third straight portion 223 and the second straight portion 222 in the first direction DR1 do not overlap each other. A distance between a projection of the second straight portion 222 on the active layer POLY1 and the source connection region T1S of the auxiliary transistor T1 in the first direction DR1 is less than a first distance, and wherein the first distance is a sum of a width of the third trunk portion GL21 in the first direction DR1 and a second distance, and wherein the second distance is a distance between the second straight portion 222 and the third trunk portion GL21 in the first direction DR1.

It can be understood that, in this embodiment, the winding arrangement of the second scan line can provide space for the source connection region T1S of the auxiliary transistor T1, to achieve a more compact layout space for the auxiliary transistor T1 in the active layer POLY1.

In one of the embodiments, the active layer POLY1 further includes a semiconductor structure 30 of a writing transistor, and wherein a projection of the first data line DL1 on the active layer POLY1 overlaps and is electrically connected to a part of the semiconductor structure 30 in a thickness direction DR3 of the display panel. A projection of the other part of the semiconductor structure 30 on the metal layer SD1 is positioned between the first data line DL1 and the second data line DL2. The writing transistor is configured to control the data signal to be written into the corresponding pixel It can be understood that, in this embodiment, without changing an original layout of the writing transistor, the auxiliary transistor T1 can be constructed between the first data line DL1 and the second data line DL2, which can achieve more compact layout design.

In one of the embodiments, this embodiment provides a display device, which includes the display panel in at least one of the above embodiments. A first scan line is configured to transmit a first scan signal. A second scan line is configured to transmit the second scan signal. In a same frame, a pulse of the first scan signal is earlier than a pulse of the second scan signal.

It is understandable that in the display device provided in this embodiment, an electrical potential of a scan signal in a first scan line is forcibly pulled down when a pulse rising edge of the scan signal in the second scanning line arrives, or an electrical potential of a scan signal in a first scan line is forcibly pulled up when a pulse down edge of the scan signal in the second scanning line arrives, by electrically connecting a first terminal of a control line and a first scan line, electrically connecting a second scan line and a gate electrode of an auxiliary transistor, electrically connecting a source electrode of the auxiliary transistor and a source connection region of the auxiliary transistor, and a second terminal of the control line, and electrically connecting a drain electrode of the auxiliary transistor, an electrical potential transmission line, and a drain connection region of the auxiliary transistor to short an electrical potential falling time of each scan signal in the display region or to short an electrical potential raising time of each scan signal in the display region. At the same time, separately construct the control line on the gate electrode layer and the electrical potential transmission line on the metal layer. In addition, a projection of the control line at least partially overlaps a projection of the electrical potential transmission line in the thickness direction of the display panel. A layout of the new structures such as the control line, the electrical potential transmission line, and the auxiliary transistor can be completed with less space, which is able to increase an aperture ratio as much as possible.

It can be understood that, for those of ordinary skill in the art, equivalent replacements or changes can be made according to the technical solutions of the present application and its inventive concept, and all these changes or replacements shall fall within the protection scope of the appended claims of the present application.

What is claimed is:

1. A display panel, comprising:
   an active layer comprising a source connection region of an auxiliary transistor and a drain connection region of the auxiliary transistor;
   a gate electrode layer comprising a control line, a gate electrode of the auxiliary transistor, a first scan line, and a second scan line, and wherein the first scan line, the second scan line are disposed in sequence along a first direction, and wherein a first terminal of the control line is electrically connected to the first scan line, and wherein the second scan line is electrically connected to the gate electrode of the auxiliary transistor; and
   a metal layer comprising an electrical potential transmission line, a source electrode of the auxiliary transistor, a drain electrode of the auxiliary transistor, a first data line, and a second data line, and wherein the source electrode of the auxiliary transistor is electrically connected to the source connection region of the auxiliary transistor and a second terminal of the control line, and wherein the drain electrode of the auxiliary transistor is electrically connected to the electrical potential transmission line and the drain connection region of the auxiliary transistor;
   wherein a projection of the electrical potential transmission line at least partially overlaps a projection of the control line in a thickness direction of the display panel;
   wherein the first data line and the second data line are sequentially arranged along a second direction; wherein in the second direction, the electrical potential transmission line is positioned between the first data line and the second data line; and wherein the electrical potential transmission line is close to the second data line.

2. The display panel according to claim 1, wherein the active layer further comprises a channel region of the auxiliary transistor, and wherein the channel region of the auxiliary transistor is positioned between the source connection region of the auxiliary transistor and the drain connection region of the auxiliary transistor, and wherein the source connection region of the auxiliary transistor, the channel region of the auxiliary transistor, and the drain connection region of the auxiliary transistor are sequentially arranged along the first direction.

3. The display panel according to claim 2, wherein the electrical potential transmission line comprises a first trunk portion, and wherein the control line comprises a second trunk portion, and wherein a projection of the second trunk portion on the metal layer overlaps with a projection of the first trunk portion on the metal layer, and wherein an extending direction of the second data line is the same as an extending direction of the first trunk portion or an extending direction of the second trunk portion.

4. The display panel according to claim 3, wherein a distance between the first trunk portion and the second data line ranges from 1.2 micrometers to 2.8 micrometers in the second direction.

5. The display panel according to claim 3, wherein the electrical potential transmission line further comprises a first winding part, and wherein the control line further comprises a second winding part, and wherein a projection of the second winding part on the metal layer overlaps the first winding part, and wherein a distance between the projection of the drain connection region of the auxiliary transistor on the metal layer and the first winding part is less than a distance between the projection of the drain connection region of the auxiliary transistor on the metal layer and the first trunk portion.

6. The display panel according to claim 1, wherein the second scan line comprises a third trunk portion and a third winding part, and wherein the third winding part comprises a first straight portion, a second straight portion, and a third straight portion connected terminal to terminal in sequence, and wherein an extending direction of the second straight portion and an extending direction of the third trunk portion are parallel to each other, and wherein the third trunk portion and the first straight portion or the third straight portion and the second straight portion are disposed in sequence along the first direction and the projections of the third trunk portion and the first straight portion or the third straight portion and the second straight portion in the first direction do not overlap each other;
   a distance between a projection of the second straight portion on the active layer and the source connection region of the auxiliary transistor in the first direction is less than a first distance, and wherein the first distance is a sum of a width of the third trunk portion in the first direction and a second distance, and wherein the second distance is a distance between the second straight portion and the third trunk portion in the first direction.

7. The display panel according to claim 1, wherein the active layer further comprises a semiconductor structure of a writing transistor, and wherein a projection of the first data line on the active layer overlaps and is electrically connected to a part of the semiconductor structure in the thickness direction of the display panel, and wherein a projection of the other part of the semiconductor structure on the metal layer is positioned between the first data line and the second data line, and wherein the writing transistor is configured to control the data signal to be written into the corresponding pixel.

8. The display panel according to claim 1, wherein the display panel further comprises a gate driving circuit, and wherein the gate driving circuit is provided on at least one side of the display panel, and wherein distribution densities of the auxiliary transistors remain the same or gradually increase as the distance between the auxiliary transistors and the gate driving circuit increases, the same or gradually increase distribution densities of the auxiliary transistors, and wherein the distribution density is a number of the auxiliary transistors in a unit area.

9. A display device comprising the display panel, the display panel comprising:
   an active layer comprising a source connection region of an auxiliary transistor and a drain connection region of the auxiliary transistor;
   a gate electrode layer comprising a control line, a gate electrode of the auxiliary transistor, a first scan line, and a second scan line, and wherein the first scan line, the second scan line are disposed in sequence along a first direction, and wherein ene a first terminal of the control line is electrically connected to the first scan line, and wherein the second scan line is electrically connected to the gate electrode of the auxiliary transistor; and
   a metal layer comprising an electrical potential transmission line, a source electrode of the auxiliary transistor, a drain electrode of the auxiliary transistor, a first data line, and a second data line, and wherein the source electrode of the auxiliary transistor is electrically connected to the source connection region of the auxiliary transistor and a second terminal of the control line, and wherein the drain electrode of the auxiliary transistor is electrically connected to the electrical potential transmission line and the drain connection region of the auxiliary transistor;
   wherein a projection of the electrical potential transmission line at least partially overlaps a projection of the control line in a thickness direction of the display panel;
   wherein the first data line and the second data line are sequentially arranged along a second direction;
   wherein in the second direction, the electrical potential transmission line is positioned between the first data line and the second data line; and wherein the electrical potential transmission line is close to the second data line;
   wherein the first scan line is configured to transmit a first scan signal, and the second scan line is configured to transmit a second scan signal, and wherein a pulse of the first scan signal is earlier than a pulse of the second scan signal in a same frame.

10. The display device according to claim 9, wherein the active layer further comprises a channel region of the auxiliary transistor, and wherein the channel region of the auxiliary transistor is positioned between the source connection region of the auxiliary transistor and the drain connection region of the auxiliary transistor, and wherein the source connection region of the auxiliary transistor, the channel region of the auxiliary transistor, the drain connection region of the auxiliary transistor are sequentially arranged along the first direction.

11. The display device according to claim 10, wherein the electrical potential transmission line comprises a first trunk portion, and wherein the control line comprises a second trunk portion, and wherein a projection of the second trunk portion on the metal layer overlaps with a projection of the first trunk portion on the metal layer, and wherein an extending direction of the second data line is the same as an extending direction of the first trunk portion or an extending direction of the second trunk portion.

12. The display device according to claim 11, wherein a distance between the first trunk portion and the second data line ranges from 1.2 micrometers to 2.8 micrometers in the second direction.

13. The display device according to claim 11, wherein the electrical potential transmission line further comprises a first winding part, and wherein the control line further comprises a second winding part, and wherein a projection of the second winding part on the metal layer overlaps the first winding part, and wherein a distance between the projection of the drain connection region of the auxiliary transistor on the metal layer and the first winding part is less than a distance between the projection of the drain connection region of the auxiliary transistor on the metal layer and the first trunk portion.

14. The display device of claim 9, wherein the second scan line comprises a third trunk portion and a third winding part, and wherein the third winding part comprises a first straight portion, a second straight portion, and a third straight portion connected terminal to terminal in sequence, and wherein an extending direction of the second straight portion and an extending direction of the third trunk portion are parallel to each other, and wherein the third trunk portion and the first straight portion or the third straight portion and the second straight portion are disposed in sequence along the first direction and the projections of the third trunk portion and the first straight portion or the third straight portion and the second straight portion in the first direction do not overlap each other;
- a distance between a projection of the second straight portion on the active layer and the source connection region of the auxiliary transistor in the first direction is less than a first distance, and wherein the first distance is a sum of a width of the third trunk portion in the first direction and a second distance, and wherein the second distance is a distance between the second straight portion and the third trunk portion in the first direction.

15. The display device according to claim 9, wherein the active layer further comprises a semiconductor structure of a writing transistor, and wherein a projection of the first data line on the active layer overlaps and is electrically connected to a part of the semiconductor structure in the thickness direction of the display panel, and wherein a projection of the other part of the semiconductor structure on the metal layer is positioned between the first data line and the second data line, and wherein the writing transistor is configured to control the data signal to be written into the corresponding pixel.

16. The display device according to claim 9, wherein the display panel further comprises a gate driving circuit, and wherein the gate driving circuit is provided on at least one side of the display panel, and wherein distribution densities of the auxiliary transistors remain the same as the distance between the auxiliary transistors and the gate driving circuit increases, and wherein the distribution density is a number of the auxiliary transistors in a unit area.

17. The display device according to claim 9, wherein the display panel further comprises a gate driving circuit, and wherein the gate driving circuit is provided on at least one side of the display panel, and wherein distribution densities of the auxiliary transistors gradually increase as the distance between the auxiliary transistors and the gate driving circuit increases, and wherein the distribution density is a number of the auxiliary transistors in a unit area.

18. The display device according to claim 11, wherein a distance between the first trunk portion and the second data line is 2.2 micrometers in the second direction.

19. The display panel according to claim 1, wherein the first scan line is configured to transmit a first scan signal, and the second scan line is configured to transmit a second scan signal, and wherein a pulse of the first scan signal is earlier than a pulse of the second scan signal in a same frame.

* * * * *